United States Patent
Doyle et al.

(10) Patent No.: US 11,134,562 B2
(45) Date of Patent: Sep. 28, 2021

(54) CHIP INTERCONNECT DEVICES

(71) Applicant: International Business Machines Corporation, Armonk, NY (US)

(72) Inventors: Matthew Doyle, Chatfield, MN (US); Gerald Bartley, Rochester, MN (US); Darryl Becker, Rochester, MN (US); Mark J. Jeanson, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 362 days.

(21) Appl. No.: 16/368,926

(22) Filed: Mar. 29, 2019

(65) Prior Publication Data

US 2020/0314997 A1    Oct. 1, 2020

(51) Int. Cl.
*H05K 1/11* (2006.01)
*H05K 3/32* (2006.01)
*H05K 1/02* (2006.01)
*H05K 3/36* (2006.01)
*H05K 1/14* (2006.01)

(52) U.S. Cl.
CPC ........... *H05K 1/0222* (2013.01); *H05K 1/113* (2013.01); *H05K 1/144* (2013.01); *H05K 3/325* (2013.01); *H05K 3/368* (2013.01); *H05K 2201/041* (2013.01); *H05K 2201/098* (2013.01); *H05K 2201/0939* (2013.01); *H05K 2201/10378* (2013.01); *H05K 2201/10734* (2013.01)

(58) Field of Classification Search
CPC ...... H05K 1/113; H05K 1/144; H05K 1/0222; H05K 3/325; H05K 3/368
See application file for complete search history.

(56) References Cited

U.S. PATENT DOCUMENTS

| | | |
|---|---|---|
| 3,634,807 A | 1/1972 | Grobe et al. |
| 3,837,074 A | 9/1974 | Griff |
| 5,308,250 A | 5/1994 | Walz |
| 5,477,159 A | 12/1995 | Hamling |
| 6,590,478 B2 | 7/2003 | Pluymers |
| 6,608,258 B1 | 8/2003 | Kwong et al. |
| 7,107,034 B2 | 9/2006 | Davis |

*Primary Examiner* — Jeremy C Norris
(74) *Attorney, Agent, or Firm* — Jamar K. Ray

(57) ABSTRACT

An interconnect device may include a first center conductor of a first material that has a first durometer. The first center conductor may be surrounded by a first inner dielectric ring, which may be surrounded by a conductive region of a second material having a second durometer. The second durometer may be different from the first durometer. The conductive region may have a first end that defines a first plane and a second end that defines a second plane. An outer dielectric ring may surround the conductive region. The first center conductor may have a first bulb and a second bulb, the first bulb may extend in a direction away from the second plane and beyond the first plane, and the second bulb may extend in a direction away from the first plane and beyond the second plane.

20 Claims, 3 Drawing Sheets

CHIP INTERCONNECT DEVICES

BACKGROUND

The present disclosure relates to interconnect devices, and more specifically, to interconnect devices with electrical signal shielding.

Structural challenges may limit the performance of chip interconnect devices. Materials and device configurations may be selected to overcome such performance limitations.

SUMMARY

Some embodiments of the present disclosure can be illustrated as a device having a first center conductor. The first center conductor may be of a first material having a first durometer. The first center conductor may be surrounded by a first inner dielectric ring. The device may have a conductive region of a second material. The second material may have a second durometer. The second durometer may be different from the first durometer. The conductive region may surround the first inner dielectric ring. The conductive region may have a first end that defines a first plane. The conductive region may also have a second end that defines a second plane. The device may also include an outer dielectric ring. The outer dielectric ring may surround the conductive region. The first center conductor may have a first bulb and a second bulb. The first bulb may extend in a direction away from the second plane and beyond the first plane. The second bulb may extend in a direction away from the first plane and beyond the second plane.

Some embodiments of the present disclosure can be illustrated as a method including obtaining a device. The device may include a first center conductor of a first material. The first material may have a first durometer. The first center conductor may be surrounded by a first inner dielectric ring. The device may include a conductive region of a second material. The second material may have a second durometer. The second durometer may be different from the first durometer. The conductive region may surround the first inner dielectric ring. The conductive region may have a first end. The first end may define a first plane. The conductive region may also have a second end. The second end may define a second plane. The device may also include an outer dielectric ring. The outer dielectric ring may surround the conductive region. The first center conductor may have a first bulb and a second bulb. The first bulb may extend in a direction away from the second plane and beyond the first plane. The second bulb may extend in a direction away from the first plane and beyond the second plane. The method may also include compressing the device between a first electronic component and a second electronic component. The first electronic component may contact the first bulb. The second electronic component may contact the second bulb.

Some embodiments of the present disclosure can be illustrated as a device having a center conductor. The center conductor may be of a first material. The first material may have a first durometer. The center conductor may be surrounded by an inner dielectric ring. The device may include a conductive ring of a second material. The second material may have a second durometer. The second durometer may be different from the first durometer. The conductive ring may surround the inner ring. The conductive ring may have a first end. The first end may define a first plane. The conductive ring may also have a second end. The second end may define a second plane. The device may also include an outer dielectric ring. The outer dielectric ring may surround the conductive ring. The center conductor may have a first bulb. The center conductor may also have a second bulb. The first bulb may extend in a direction away from the second plane and beyond the first plane. The second bulb may extend in a direction away from the first plane and beyond the second plane. A central axis may pass approximately through a center of the center conductor and a center of the conductive ring.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1A:
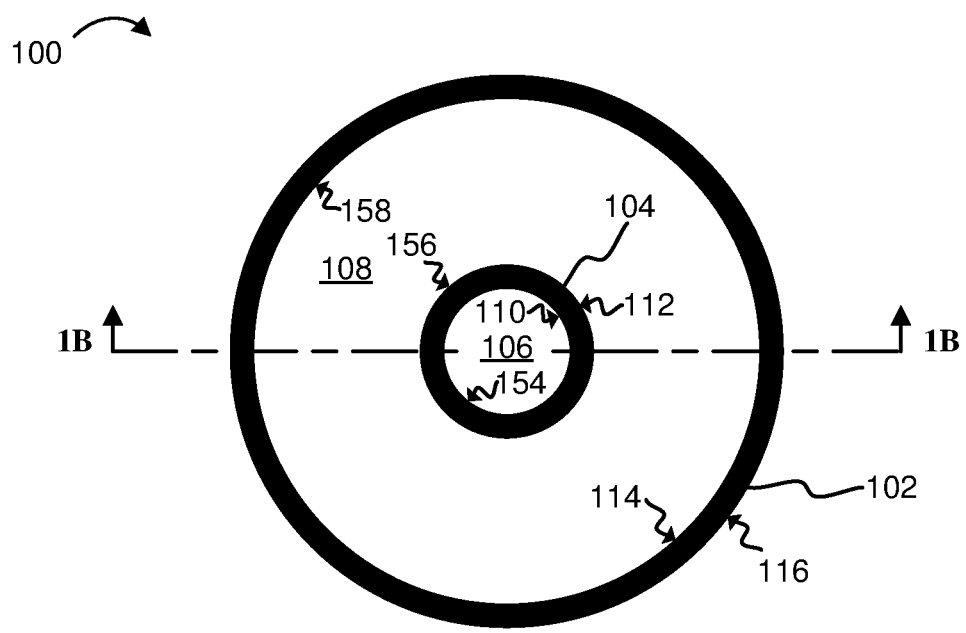
FIG. 1A depicts a top view of a chip interconnect device according to embodiments of the present disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to interconnection devices for electronic components, more particular aspects relate to interconnection devices that provide electrical signal shielding between connected electronic components. While the present disclosure is not necessarily limited to such applications, various aspects of the disclosure may be appreciated through a discussion of various examples using this context.

Electronic components may be attached to one another via a variety of connection types. For example, a first electronic component, such as a microprocessor, may be attached to a second electronic component, such as a PCB ("Printed Circuit Board"), by a ball grid array or a column grid array connection. Such connections may include hundreds or thousands of electrical contacts in close proximity. Each electrical contact may provide an electrical signal path between the first electronic component and the second electronic component.

Signals transmitted through these electrical signal paths may be susceptible to degradation due to interference with other signals in close proximity. Such interference may be particularly problematic in environments where high-frequency signals are present. Additionally, manufacturing and handling processes of electronic components may cause irregularities in their electrical contacts, such as electrical contacts having dimpled or uneven surfaces. Such irregularities may contribute to poor physical and electrical connections between electronic components and may therefore contribute to signal degradation between electronic components. Minimizing inductance may also present a challenge to configuring a connection between electronic components.

To address these and other problems, embodiments of the present disclosure include a chip interconnect device having a center conductor with first and second bulbs that extend beyond first and second ends of a conductive region. The first and second bulbs of the chip interconnect device may improve the device's ability to form effective physical and electrical connections to electrical contacts that have surface irregularities. The conductive region of the chip interconnect device may provide an electrical ground path that surrounds an electrical signal path through the center conductor; thus, the conductive region may provide signal shielding for an electrical signal transmitted through the center conductor. Accordingly, the conductive region may improve the integrity of the electrical signal transmitted through the center conductor.

Embodiments of the present disclosure include the center conductor and the conductive region being composed, respectively, of a first elastomeric material having a first durometer, or hardness, and a second elastomeric material having a second durometer. The use of such elastomeric materials may facilitate compression of the interconnect device, which may result in a reduced length of each signal path between electronic components connected by the interconnect device. The reduced length may correspond with a reduced inductance of each signal path; thus, electronic components may benefit from a reduced inductance of numerous (e.g., hundreds or thousands) of signal paths through interconnect devices of the present disclosure. Furthermore, the use of elastomeric materials having different durometers may facilitate proper alignment of the center conductor during compression of the interconnect device, which may, in turn, improve the integrity of electrical signals transmitted through the center conductor. Therefore, embodiments of the present disclosure that include elastomeric materials having different durometers may provide a chip interconnect device having improved performance in a compressed state.

In some embodiments of the present disclosure, a pair of discrete chip interconnect devices may be positioned adjacent to one another to provide a differential interconnect. Some embodiments of the present disclosure may include a chip interconnect device having two center conductors that are positioned within a conductive region, which may also provide a differential interconnect. These differential interconnects may provide improved signal integrity and increased signal transmission speed between electronic components connected by the differential interconnects.

Figure 1B:
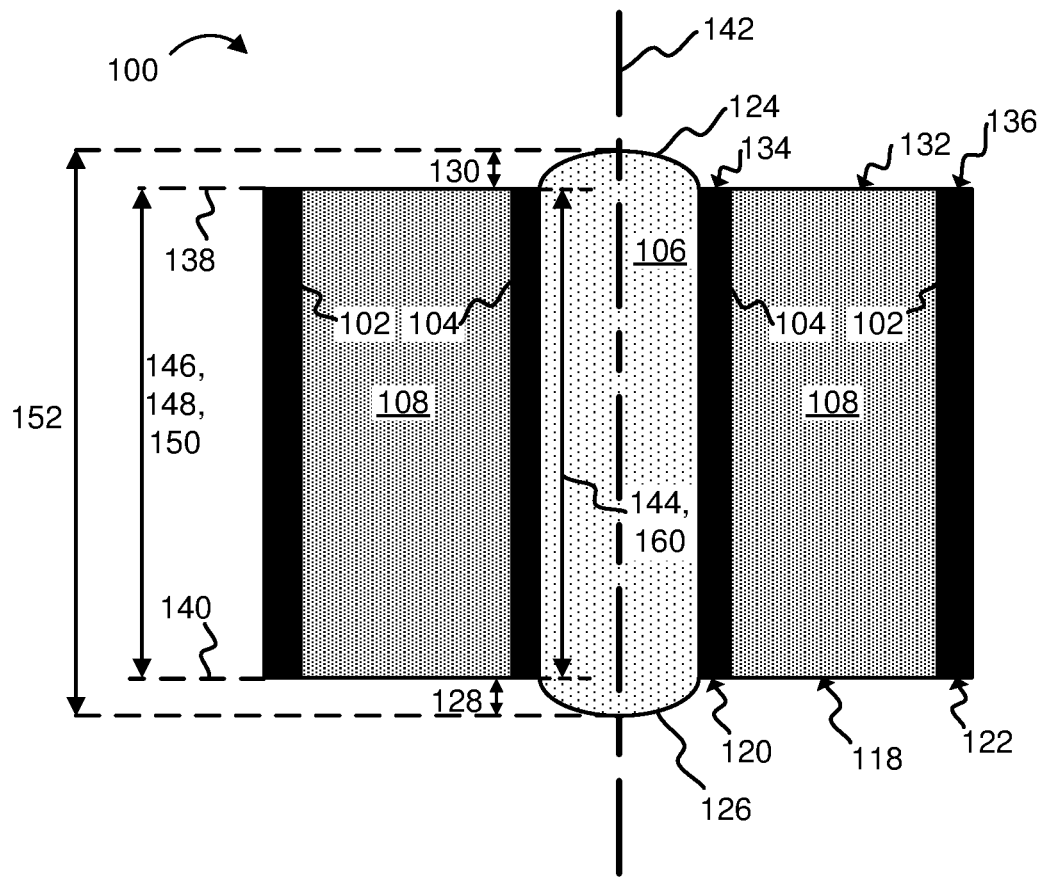
FIG. 1B depicts a front section view of the chip interconnect device of FIG. 1A.

Turning to the figures, FIGS. 1A and 1B illustrate a chip interconnect device 100 according to an embodiment of the present disclosure. FIG. 1A illustrates a top view of the chip interconnect device 100, and FIG. 1B illustrates a front section view of the chip interconnect device 100.

FIGS. 1A-3B are not to scale; the relative sizes of the features shown are for illustration purposes and are not meant to be exact. Features that are shown to have equivalent dimensions (e.g. lengths and heights) may have approximately equivalent dimensions.

FIG. 1A illustrates the chip interconnect device 100 having a center conductor 106. In some embodiments, the center conductor 106 may provide an electrical signal path. The center conductor 106 has an outer surface 154 that contacts an inner surface 110 of an inner dielectric ring 104. The inner dielectric ring 104 may provide electrical insulation between the center conductor 106 and a conductive ring 108. The inner dielectric ring 104 has an outer surface 112 that contacts an inner surface 156 of the conductive ring 108. In some embodiments, the conductive ring 108 may provide an electrical ground path to shield an electrical signal path through the center conductor 106. The conductive ring 108 has an outer surface 158 that contacts an inner surface 114 of an outer dielectric ring 102. The outer dielectric ring 102 has an outer surface 116. The outer dielectric ring 102 may protect the conductive ring 108 from contact with foreign objects. The center conductor 106, the inner dielectric ring 104, the conductive ring 108, and the outer dielectric ring 102 of the chip interconnect device 100 are approximately concentric, or approximately share a common center.

Although FIG. 1A illustrates the chip interconnect device 100 having an elliptical cross-section, in some embodiments, the chip interconnect device 100 may include one or more polygonal cross-sections.

FIG. 1B illustrates a center cross-section of the chip interconnect device 100. The chip interconnect device 100 has a center axis 142 that passes approximately through a center of the center conductor 106, the inner dielectric ring 104, the conductive ring 108, and the outer dielectric ring 102; thus, the components of the chip interconnect device 100 are approximately coaxial. The conductive ring 108 of the chip interconnect device 100 has a first end 132 that defines a first plane 138 and a second end 118 that defines a second plane 140.

The center conductor 106 includes a first bulb 124 having a first bulb height 130 beyond the first plane 138, a second bulb 126 having a second bulb height 128 beyond the second plane 140, and an interior section 144 having an interior section height 160. The interior section 144 of the center conductor 106 may extend between the first plane 138 and the second plane 140 and may be surrounded by the inner dielectric ring 104, the conductive ring 108, and the outer dielectric ring 102. The first bulb 124 extends beyond the first plane 138 in a direction away from the second plane 140, and the second bulb 126 extends beyond the second plane 140 in a direction away from the first plane 138.

A total height 152 of the center conductor 106 is the sum of the first bulb height 130, the interior section height 160, and the second bulb height 128. A height 146 of the inner dielectric ring 104 is a length that extends between a first end 134 of the inner dielectric ring 104 and a second end 120 of the inner dielectric ring 104. A height 148 of the conductive ring 108 is a length that extends between a first end 132 of the conductive ring 108 and a second end 118 of the conductive ring 108. A height 150 of the outer dielectric ring 102 is a length that extends between a first end 136 of the outer dielectric ring 102 and a second end 122 of the outer dielectric ring 102.

The total height 152 of the center conductor 106 is greater than the height 146 of the inner dielectric ring 104, the height 148 of the conductive ring 108, and the height 150 of the outer dielectric ring 102. In this configuration, the center conductor 106 of the chip interconnect device 100 may be more likely to fully contact a contact surface having an irregular or uneven height. This feature is discussed further in FIGS. 3A and 3B.

In some embodiments, the center conductor 106, the inner dielectric ring 104, the conductive ring 108, and the outer dielectric ring 102 of the chip interconnect device 100 may be formed of deformable materials, such as elastomers. In these embodiments, the chip interconnect device 100 may be compressed such that heights 128, 130, 146, 148, 150, 152, and 160 may be reduced from an initial "pre-compression" value to a resultant "post-compression" value, resulting in a reduced overall height of the chip interconnect device 100. The reduced overall height of the chip interconnect device may provide a signal path having a lower inductance than a signal path of a chip interconnect device having a greater height.

In some embodiments, the center conductor 106 and the conductive ring 108 may be formed, respectively, of a first material having a first durometer and a second material having a second durometer. For example, the center conductor 106 may be formed of a first electrically conductive elastomer and the conductive ring 108 may be formed of a second electrically conductive elastomer. The first electrically conductive elastomer may have a higher durometer than the second electrically conductive elastomer. Such use of elastomers having different durometers may facilitate improved alignment of the center conductor within the chip interconnect device.

For example, continuing with the configuration discussed above, forming the center conductor and the conductive ring from elastomers may facilitate compression of the chip interconnect device during assembly with other electronic components ("assembly" may refer to adding or joining the interconnect device to one or more other electronic components). During such compression, a center conductor composed of an elastomer having a higher durometer, or having more rigidity, than the elastomer forming the conductive ring may maintain a centered and vertical alignment within the conductive ring. Such alignment may result from expansive forces of the conductive ring that press inward against the center conductor as the chip interconnect device is compressed.

Figure 2A:
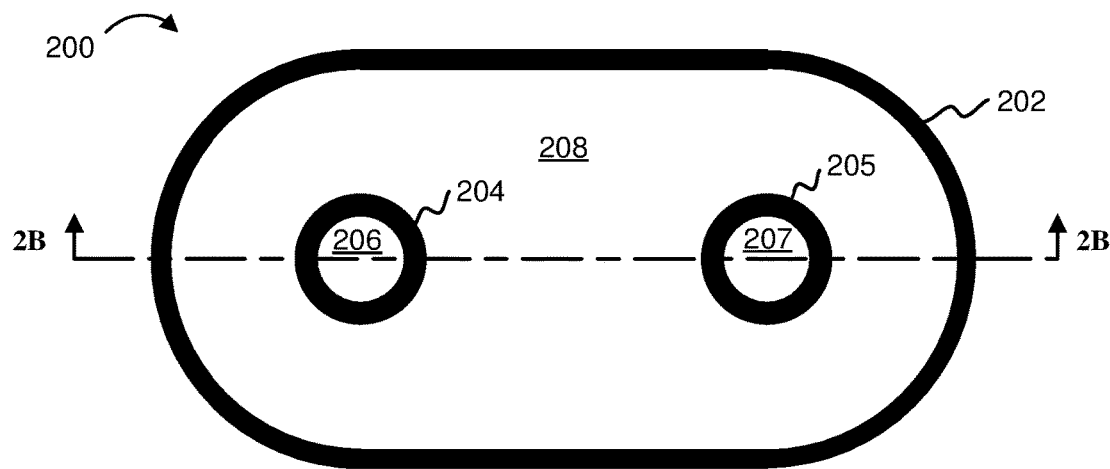
FIG. 2A depicts a top view of a chip interconnect device having two center conductors, according to embodiments of the present disclosure.
Figure 2B:
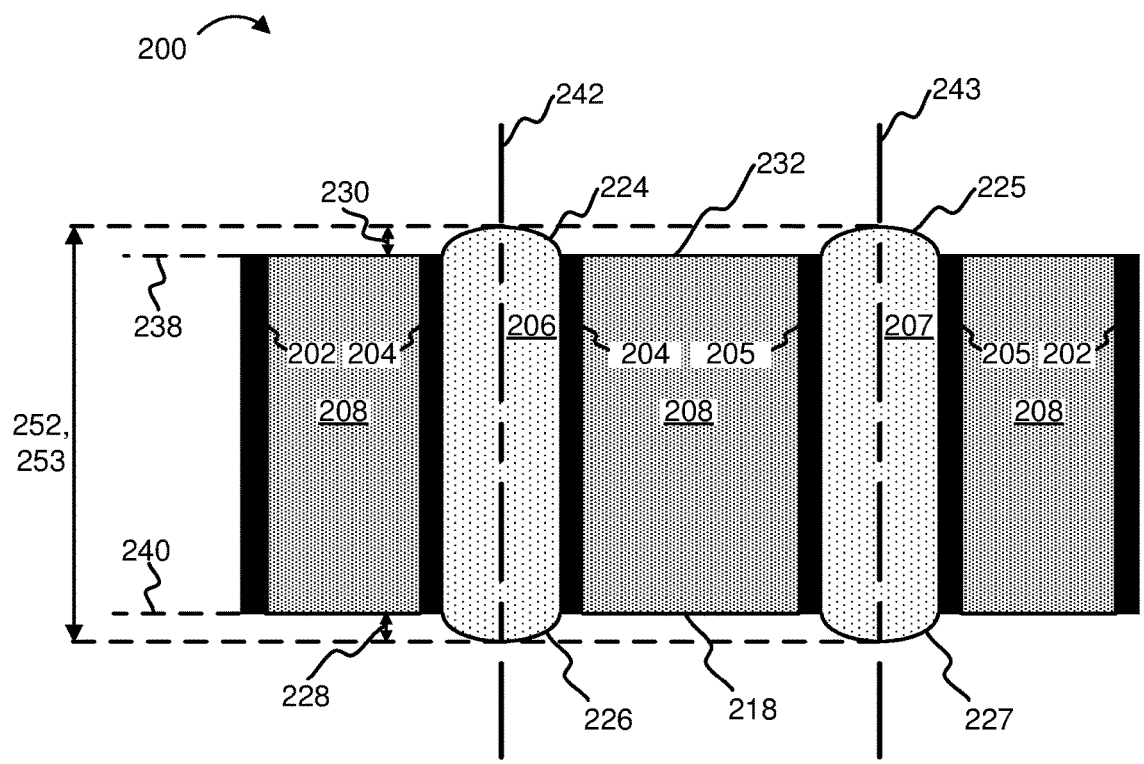
FIG. 2B depicts a front section view of the chip interconnect device of FIG. 2A.

FIGS. 2A and 2B illustrate a chip interconnect device 200 according to an embodiment of the present disclosure. FIG. 2A illustrates a top view of the chip interconnect device 200, and FIG. 2B illustrates a front section view of the chip interconnect device 200. In some embodiments, chip interconnect device 200 may provide improved signal integrity by providing a differential signal path.

FIG. 2A illustrates a first center conductor 206 that may carry an electrical signal of a first polarity and a second center conductor 207 that may carry an electrical signal of a second polarity that is opposite the first polarity so that the chip interconnect device 200 may provide a differential signal. The first center conductor 206 and the second center conductor 207 are each surrounded, respectively, by a first inner dielectric ring 204 and a second inner dielectric ring 205. The first inner dielectric ring 204 may provide electrical insulation between the first center conductor 206 and a conductive region 208, which surrounds first inner dielectric ring 204 and second inner dielectric ring 205. The second inner dielectric ring 205 may provide electrical insulation between the second center conductor 207 and the conductive region 208. The conductive region 208 is surrounded by an outer dielectric ring 202, which may protect the conductive region 208 from contact with foreign objects.

FIG. 2B illustrates a center cross-section of the chip interconnect device 200. The first center conductor 206 and the second center conductor 207 have, respectively, a first center axis 242 and a second center axis 243. The first center axis 242 passes approximately through a center of the first center conductor 206, and the second center axis 243 passes approximately through a center of the second center conductor 207. The first center axis 242 and the second center axis 243 are approximately parallel.

The conductive region 208 of the chip interconnect device 200 has a first end 232 that defines a first plane 238 and a second end 218 that defines a second plane 240. The first center conductor 206 includes a first bulb 224 having a first bulb height 230 beyond the first plane 238 and a second bulb 226 having a second bulb height 228 beyond the second plane 240. The first bulb 224 extends beyond the first plane 238 in a direction away from the second plane 240, and the second bulb 226 extends beyond the second plane 240 in a direction away from the first plane 238. Similarly, the second center conductor 207 includes a third bulb 225 having a third bulb height 230 beyond the first plane 238 and a fourth bulb 227 having a fourth bulb height 228 beyond the second plane 240. The third bulb 225 extends beyond the first plane 238 in a direction away from the second plane 240, and the fourth bulb 227 extends beyond the second plane 240 in a direction away from the first plane 238. A total height 252 of the first center conductor 206 is approximately a distance between a top end of the first bulb 224 and a top end of the second bulb 226. Similarly, a total height 253 of the second center conductor 207 is approximately a distance between a top end of the third bulb 225 and a top end of the fourth bulb 227.

Like the chip interconnect device 100, in some embodiments, the chip interconnect device 200 may be formed of elastomeric materials. The first center conductor 206 and the second center conductor 207 may be formed of a first electrically conductive elastomer, and the conductive region 208 may be formed of a second electrically conductive elastomer. In some embodiments, the first electrically conductive elastomer may have a higher durometer than the second electrically conductive elastomer to facilitate improved alignment of the center conductors within the chip interconnect device 200. Additionally, the chip interconnect device 200 may be compressed during an assembly process as discussed below in FIGS. 3A and 3B.

Figure 3A:
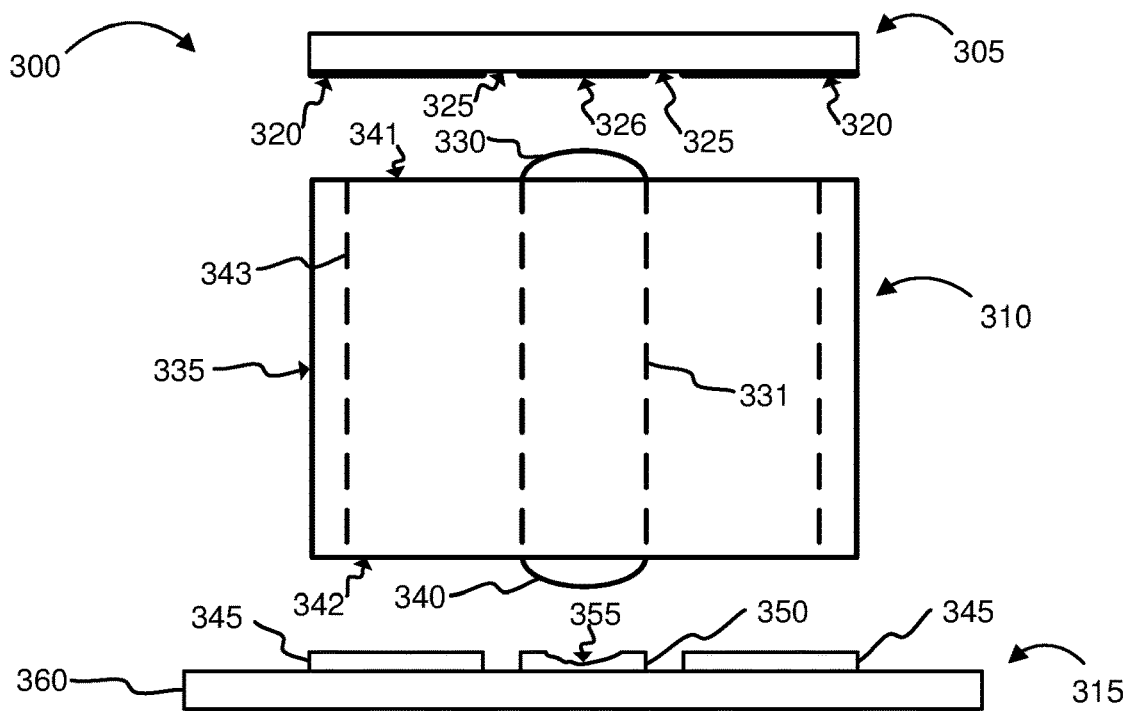
FIG. 3A depicts a chip interconnect device before it is assembled with other electronic components, according to embodiments of the present disclosure.
Figure 3B:
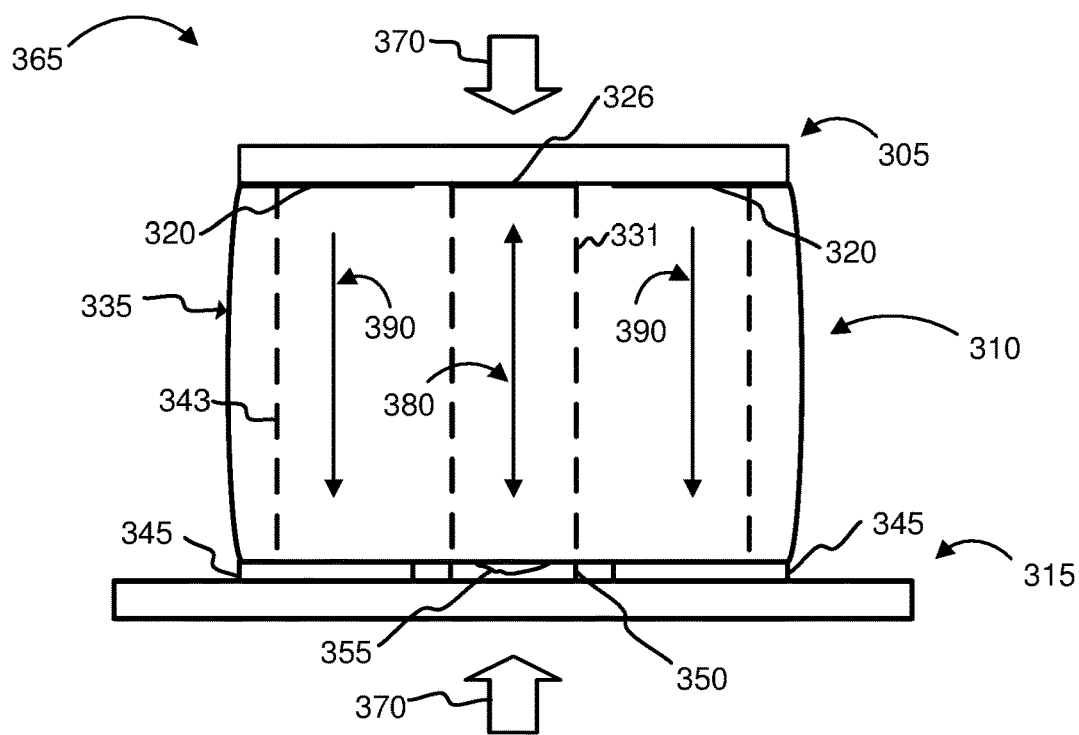
FIG. 3B depicts the chip interconnect device of FIG. 3A after it has been assembled with other electronic components, according to embodiments of the present disclosure.

FIGS. 3A and 3B illustrate, respectively, a chip interconnect device 310 in a pre-assembled state 300 and in an assembled state 365. In the assembled state 365, the chip interconnect device 310 may provide a ground shielded connection between a first electronic component 305 and a second electronic component 315.

FIG. 3A illustrates a first electronic component 305, a chip interconnect device 310, and a second electronic component 315 before they are assembled. The first electronic component 305 includes grounding surfaces 320 for establishing an electrical ground path when assembled with another electronic component. The first electronic component 305 also includes a signal surface 326 for establishing an electrical signal path when assembled with another electronic component. The signal surface 326 and the grounding surfaces 320 are separated by an insulation surface 325, such as a non-plated surface of a PCB, that electrically insulates the signal surface 326 from the grounding surfaces 320.

The chip interconnect device 310 includes a first bulb 330 of a center conductor 331 and a second bulb 340 of the center conductor 331. The center conductor is surrounded by a conductive ring 343 having a first end 341 and a second end 342. An inner dielectric ring (not shown) electrically insulates the center conductor 331 from the conductive ring 343. The chip interconnect device 310 includes an outer dielectric ring that has an outer wall 335 that has a substantially flat surface before the chip interconnect device is compressed. The center conductor 331 and the conductive ring 343 may be formed of conductive elastomeric materials. The inner dielectric ring and the outer dielectric ring may be formed of electrically insulating elastomeric materials.

The second electronic component 315 includes a PCB 360 that supports ground pads 345 and a PCB pad 350. In some embodiments, the ground pads 345 and the PCB pad 350 may be included in a pattern such as a ball grid array or a column grid array. The ground pads 345 and the PCB pad 350 provide surfaces for electrically connecting the second electronic component 315 to another electronic component, such as the chip interconnect device 310. The ground pads 345 are formed from an electrically conductive material, such as a deposited metal, and may establish an electrical ground path when assembled with another electronic component. The PCB pad 350 is also formed from an electrically conductive material and may establish an electrical signal path when assembled with another electronic component. The PCB pad 350 may include a surface defect 355, such as a dimple or other cavity. The surface defect 355 may be the result of a manufacturing process. For example, the PCB pad 350 may be probed during a quality assurance inspection of the second electronic component 315, and the probing may form an indented surface on the PCB pad. In another example, an electrodeposited metallic layer may form unevenly when the PCB is manufactured, resulting in the PCB pad having a cavity.

FIG. 3B illustrates the chip interconnect device 310 in an assembled state 365. In the assembled state 365, the chip interconnect device 310 has been assembled with the first electronic component 305 and the second electronic component 315 after an application of compressive forces 370 (the arrows indicate the direction of the compression). In the assembled state, the first bulb 330 of the center conductor 331 may be compressed against the signal surface 326 and the second bulb 340 of the center conductor 331 may be compressed against the PCB pad 350 and fill the surface defect 355 such that no electrically significant gap is present between the center conductor 331 and the PCB pad 350. Accordingly, the chip interconnect device 310 may form an effective signal path 380 between the first electronic component 305 and the second electronic component 315 despite the presence of surface defect 355. Also, in the assembled state, the grounding surfaces 320 of the first electronic component 305 may contact the first end 341 of the conductive ring 343, and the ground pads 345 of the second electronic component 315 may contact the second end 342 of the conductive ring 343. Such contacts may provide a ground path 390 between the first electronic component 305 and the second electronic component 315.

Thus, in the assembled state, an electrical signal may pass along the signal path 380, from the signal surface 326 of the first electronic component 305 through the center conductor 331 to the PCB pad 350 of the second electronic component 315. At the same time, a ground signal may pass along the signal path 390, from grounding surfaces 320 of the first electronic component 305 through the conductive ring 343 to the ground pads 345 of the second electronic component 315. As a result of this configuration, the ground path 390 between the first electronic component 305 and the second electronic component 315 may shield the signal path 380.

In response to the compressive forces 370 that have been applied to the interconnect device 310, the outer wall 335 of the outer dielectric ring may form a substantially curved surface and a height of the chip interconnect device may be reduced. The inductance of the signal path may be reduced as a result of the reduced height of the chip interconnect device.

The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A device comprising:
   a first center conductor of a first material having a first durometer,
     the first center conductor surrounded by a first inner dielectric ring;
   a conductive region of a second material having a second durometer,
     the second durometer being different from the first durometer,
     the conductive region surrounding the first inner dielectric ring,
       the conductive region having a first end that defines a first plane and a second end that defines a second plane;
   an outer dielectric ring surrounding the conductive region;
   wherein the first center conductor has a first bulb and a second bulb,
     the first bulb extending in a direction away from the second plane and beyond the first plane, and
     the second bulb extending in a direction away from the first plane and beyond the second plane.

2. The device of claim 1, wherein the first material comprises a first conductive elastomer and wherein the second material comprises a second conductive elastomer.

3. The device of claim 2, wherein the first durometer is greater than the second durometer.

4. The device of claim 1, wherein the second bulb contacts a pad of a ball grid array.

5. The device of claim 1, wherein the conductive region comprises an electrical ground path.

6. The device of claim 1, wherein compressive forces are applied to the device, resulting in an assembled state of the device.

7. The device of claim 6, wherein the assembled state comprises the device having a reduced height while providing a signal path and a ground path between a first electronic component and a second electronic component.

8. The device of claim 1, further comprising a second center conductor of the first material;
   wherein the second center conductor is surrounded by a second inner dielectric ring;
   wherein the conductive region surrounds the second inner dielectric ring;
   wherein the second center conductor includes a third bulb and a fourth bulb;
     the third bulb extending in a direction away from the second plane and beyond the first plane, and
     the fourth bulb extending in a direction away from the first plane and beyond the second plane.

9. The device of claim 8, wherein the first center conductor has a first polarity and the second center conductor has a second polarity; and wherein the second polarity is opposite the first polarity.

10. The device of claim 9, wherein compressive forces are applied to the device, resulting in an assembled state of the device.

11. The device of claim 10, wherein the assembled state comprises the device having a reduced height while providing a differential signal path and a ground path between a first electronic component and a second electronic component.

12. A device comprising:
a center conductor of a first material having a first durometer,
the center conductor surrounded by an inner dielectric ring;
a conductive ring of a second material having a second durometer,
the second durometer being different from the first durometer,
the conductive ring surrounding the inner dielectric ring,
the conductive ring having a first end that defines a first plane and a second end that defines a second plane;
an outer dielectric ring surrounding the conductive ring;
wherein the center conductor has a first bulb and a second bulb,
the first bulb extending in a direction away from the second plane and beyond the first plane,
the second bulb extending in a direction away from the first plane and beyond the second plane; and
a central axis passing approximately through a center of the center conductor and a center of the conductive ring.

13. The device of claim 12, wherein the first material comprises a first conductive elastomer and wherein the second material comprises a second conductive elastomer.

14. The device of claim 13, wherein the first durometer is greater than the second durometer.

15. The device of claim 14, wherein the conductive ring comprises an electrical ground path.

16. A method comprising:
obtaining a device comprising:
a first a first center conductor of a first material having a first durometer,
the first center conductor surrounded by a first inner dielectric ring;
a conductive region of a second material having a second durometer,
the second durometer being different from the first durometer,
the conductive region surrounding the first inner dielectric ring,
the conductive region having a first end that defines a first plane and a second end that defines a second plane;
an outer dielectric ring surrounding the conductive region;
wherein the first center conductor has a first bulb and a second bulb,
the first bulb extending in a direction away from the second plane and beyond the first plane, and
the second bulb extending in a direction away from the first plane and beyond the second plane;
compressing the device between a first electronic component that contacts the first bulb and a second electronic component that contacts the second bulb.

17. The method of claim 16, wherein the first material comprises a first conductive elastomer and wherein the second material comprises a second conductive elastomer.

18. The method of claim 17, wherein the first durometer is greater than the second durometer.

19. The method of claim 16, wherein the second bulb contacts a pad of a ball grid array.

20. The method of claim 16, wherein the conductive region comprises an electrical ground path.

* * * * *